(12) United States Patent
Yin et al.

(10) Patent No.: US 8,377,777 B2
(45) Date of Patent: Feb. 19, 2013

(54) SEMICONDUCTOR DEVICE AND METHOD OF FABRICATING THE SAME

(75) Inventors: Haizhou Yin, Poughkeepsie, NY (US); Zhijiong Luo, Poughkeepsie, NY (US); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 41 days.

(21) Appl. No.: 12/999,796

(22) PCT Filed: Sep. 17, 2010

(86) PCT No.: PCT/CN2010/001429
§ 371 (c)(1),
(2), (4) Date: Dec. 17, 2010

(87) PCT Pub. No.: WO2011/130889
PCT Pub. Date: Oct. 27, 2011

(65) Prior Publication Data
US 2011/0260262 A1    Oct. 27, 2011

(30) Foreign Application Priority Data

Apr. 21, 2010  (CN) .......................... 2010 1 0157574

(51) Int. Cl.
*H01L 27/088* (2006.01)
*H01L 21/8232* (2006.01)

(52) U.S. Cl. ........ 438/279; 438/229; 438/299; 438/303; 257/390; 257/E21.615

(58) Field of Classification Search .................. 257/202, 257/311, 316, 390, E31.615, E27.06; 438/279, 438/229, 299, 303
See application file for complete search history.

(56) References Cited

U.S. PATENT DOCUMENTS

| 6,649,481 B2 | 11/2003 | Wu |
| 6,835,970 B2 | 12/2004 | Nam et al. |
| 7,015,094 B2 | 3/2006 | Lee |

OTHER PUBLICATIONS

International Search Report and Written Opinion dated Feb. 3, 2011, issued by the Chinese Patent Office in Chinese Patent Application No. PCT/CN2010/001429 (9 pages).

*Primary Examiner* — Davienne Monbleau
*Assistant Examiner* — Whitney T Moore
(74) *Attorney, Agent, or Firm* — Osha Liang LLP (57) ABSTRACT

A semiconductor device includes a semiconductor substrate; gates, spacers on both sides of the respective gates, and source and gain regions on both sides of the respective spacers, which are formed on the semiconductor substrate; lower contacts located on the respective source and gain regions and abutting outer-sidewalls of the spacers, with bottoms covering at least a portion of the respective source and gain regions; an inter-layer dielectric layer formed on the gates, the spacers, the source and gain regions, and the lower contacts, wherein the respective source and gain regions of each of the transistor structures are isolated from each other by the inter-layer dielectric layer; and upper contacts formed in the inter-layer dielectric layer and corresponding to the lower contacts. Methods for fabricating such a semiconductor device and for manufacturing contacts for semiconductor devices.

6 Claims, 7 Drawing Sheets

SEMICONDUCTOR DEVICE AND METHOD OF FABRICATING THE SAME

FIELD OF INVENTION

The present invention generally relates to the field of integrated circuits fabrication, and more particularly, to a semiconductor device and a method of fabricating the same, and especially, to a contact of the semiconductor device and the fabrication of the contact.

BACKGROUND

With increasingly scaling of integrated circuits (IC's), contacts between respective layers of IC chips are becoming smaller and smaller. However, conventional processes have many problems in fabricating the contacts whose size is increasingly reduced. For example, in order to etch a small contact hole through a dielectric layer, a high bias is required for the reactive ion etching (RIE), which, however, results in a reduced etching selectivity in the RIE of the contact hole. In such a case, the RIE either causes an under-etching of the dielectric layer (with a low RIE bias), or an over-etching of the dielectric layer (with a high RIE bias).

In order to solve the problem, reference 1 (US 2009/0072400 A1) discloses a process of fabricating a contact in two parts. Specifically, the contact comprises two parts: a lower contact and an upper contact. First, the lower contact is formed in a first dielectric layer; and then, the upper contact is formed in a second dielectric layer on the first dielectric layer. The lower and upper contacts are aligned with and electrically connected to each other, so as to constitute a complete contact. In this way, by forming the contact in two steps, the difficulty in etching the contact hole in a single step is significantly reduced.

However, in the above process, the fabrication of the lower contact relies on the photolithography, which has strict requirements on the overlay and critical size of the contact hole. Otherwise, the gate and the source/drain contacts are very likely to be shorted. Accordingly, there is a need for a novel semiconductor device and a method of fabricating the same to overcome the problems of the prior art.

SUMMARY OF THE INVENTION

In view of the above problems, it is an object of the present invention to provide a semiconductor device and a method of fabricating the same in order to overcome the problems of the prior art, and especially, to eliminate the requirements for a photolithography in forming the lower contacts.

According to an aspect of the present invention, it is provided a method for fabricating a semiconductor device, the method comprising: providing a semiconductor substrate; on the semiconductor substrate, forming gates, spacers on both sides of the respective gates, and source/drain regions at both sides of the respective spacers; depositing a contact material on the semiconductor substrate, and planarizing the contact material to expose the top of the gates; etching the contact material to retain at least portions of the contact material covering at least a portion of the respective source/drain regions, so as to form lower contacts and electrically isolate the source/drain regions of each of the transistor structures; depositing an inter-layer dielectric layer; and forming contact holes in the inter-layer dielectric layer corresponding to the lower contacts, and filling a further contact material in the contact holes to form upper contacts.

Preferably, the step of depositing the contact material on the semiconductor substrate may comprise: sequentially depositing a first liner and a first conductive material layer; and planarizing the first liner and the first conductive material layer which have been deposited until the top of the gate is exposed.

The step of etching the contact material may comprise: coating a photo resist and patterning it, so that the patterned photo resist covers said at least a portion of the respective source/drain regions, leaves spaces between the source/drain regions of adjacent transistor structures, and covers a width less than the gate width; and etching the contact material by using the patterned photo resist as a mask, to form the lower contacts on the respective source/drain regions.

The step of filling the further contact material in the contact holes to form the upper contacts may comprise: sequentially depositing a second liner and a second conductive material layer; and planarizing the second liner and the second conductive material layer which have been deposited until the top of the inter-layer dielectric layer is exposed.

After the step of forming the lower contacts and before the step of depositing the inter-layer dielectric layer, the method may further comprise performing a replacement gate process to form gate stacks. Thus, the processes according to embodiments of the present invention are compatible with the replacement gate process.

According to another aspect of the present invention, there is provided a semiconductor device, comprising: a semiconductor substrate; gates, spacers on both sides of the respective gates, and source/drain regions on both sides of the respective spacers, which are formed on the semiconductor substrate; lower contacts located on the respective source/drain regions and abutting outer-sidewalls of the spacers, with bottoms covering at least a portion of the respective source/drain regions; an inter-layer dielectric layer formed on the gates, the spacers, the source/drain regions and the lower contacts, wherein the respective source/drain regions of each of the transistor structures are isolated from each other by the inter-layer dielectric layer; and upper contacts formed in the inter-layer dielectric layer and corresponding to the lower contacts.

Preferably, the lower contacts comprise a first liner and a first conductive material layer deposited sequentially. The first liner may comprise one or more material selected from the group of TiN, TiAlN, TaN, TaAlN, Ta, and Ti, and the first conductive material layer may comprise one or more material selected from the group of W, Al, and Cu.

Preferably, the upper contacts may comprise a second liner and a second conductive material layer deposited sequentially.

Preferably, the top of the lower contacts is flush with the top of the gates. Further, in the gate width direction, the lower contacts have a width less than the gate width.

According to the embodiments of the present invention, the source/drain contacts are formed by directly depositing the contact material on the source/drain regions, and then electrical isolation among the respective transistor structures is achieved by etching. As a result, the complicated photolithography process is avoided. Further, the present invention is compatible with the replacement gate process.

BRIEF DESCRIPTIONS OF THE DRAWINGS

The above and other objects, features and advantages of the present invention will be more apparent by describing embodiments thereof in detail with reference to the attached drawings, wherein.

DETAILED DESCRIPTION OF PREFERRED EMBODIMENTS

Hereinafter, the present invention is described with reference to embodiments shown in the attached drawings. However, it is to be understood that the descriptions are only provided for illustrative purpose, rather than limiting the present invention. Further, in the following, descriptions of known structures and techniques are omitted so as not to obscure the concept of the present invention.

In the drawings, various layer-structural diagrams according to embodiments of the present invention are shown. However, they are not drawn to scale, and some features may be enlarged while some features may be omitted for clarity. Shapes, sizes and relative positions of respective regions and layers shown in the drawings are only illustrative, and deviations therefrom may occur due to manufacture tolerances and technical limits. Those skilled in the art can also devise regions/layers of different shapes, sizes and relative positions as desired.

Figure 12:
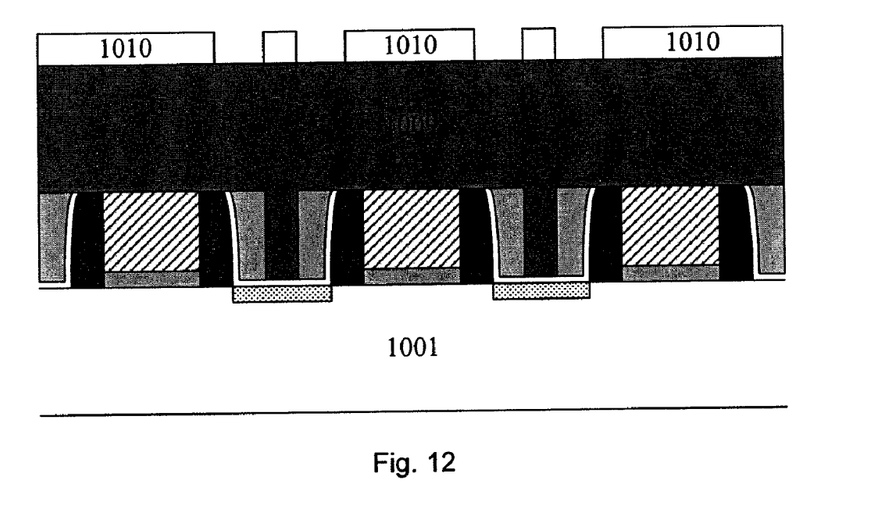
Figure 13:
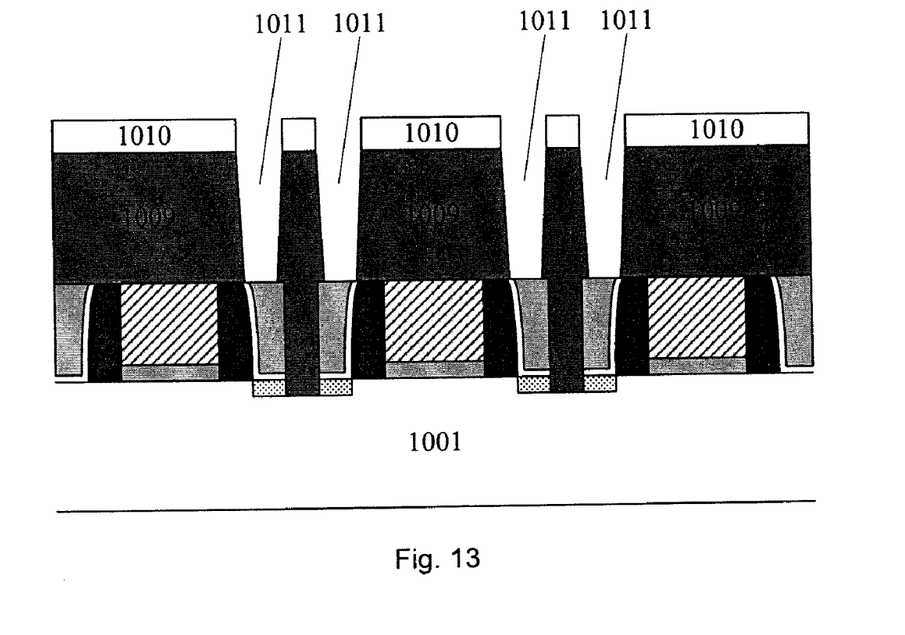
Figure 14:
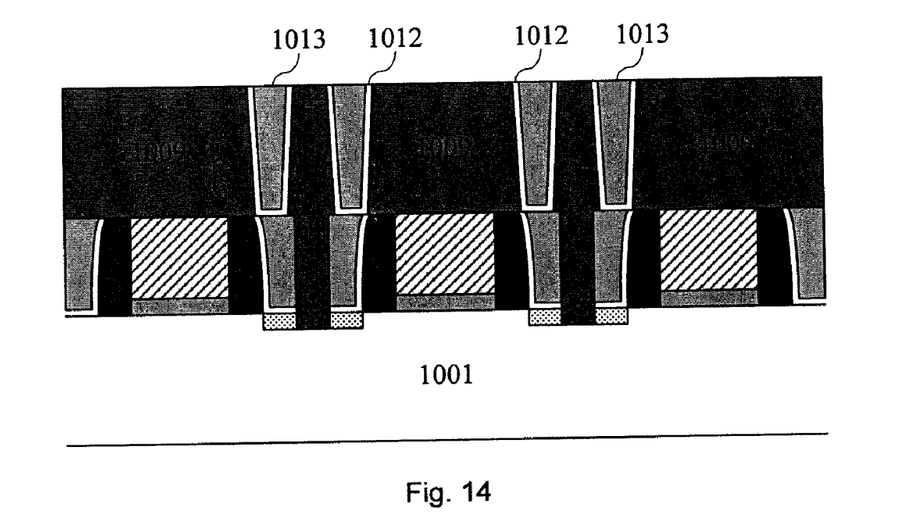

According to an embodiment of the present invention, a contact formed in a semiconductor device comprises two parts: a lower contact (see 1008 shown in FIGS. 9 and 10) and an upper contact (see 1013 shown in FIG. 14). FIGS. 1-9 show respective steps of a process flow of forming the lower contact according to an embodiment of the present invention, and FIGS. 11-14 show respective steps of a process flow of forming the upper contact according to an embodiment of the present invention.

Figure 1:
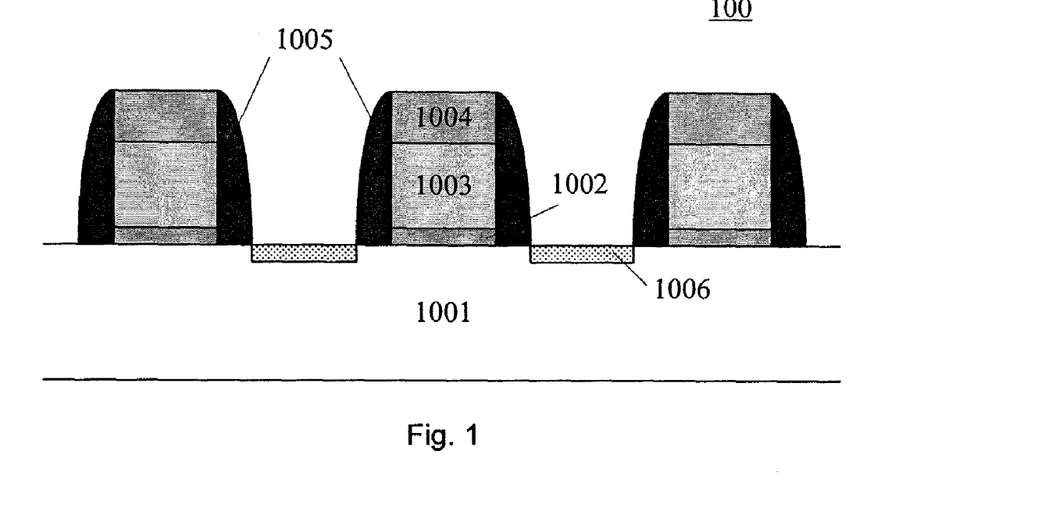
FIGS. 1-9 are cross-sectional views schematically showing intermediate device structures in respective steps of a process flow of forming lower contacts according to an embodiment of the present invention.

Referring to FIG. 1, an initial structure 100 is shown. The initial structure comprises a plurality of transistor structures formed on a semiconductor substrate 1001, each of the transistor structures comprising a gate. Here, the gate, for example, comprises a gate stack and a spacer 1005 on both sides of the gate stack. The gate stack may comprise a gate dielectric layer 1002, a gate body layer 1003 and a hard mask layer 1004. The initial structure 100 may be formed in various ways. For example, firstly, the gate dielectric layer 1002 (e.g. comprising $SiO_2$, or preferably a high-k material), the gate body layer 1003 (e.g. comprising poly-silicon) and the hard mask layer 1004 (e.g. comprising SiN or $SiO_2$) are deposited sequentially on the semiconductor substrate 1001 and then are patterned to form the gate stack. Subsequently, a doping, such as that for LDD (light doped drain), is performed using the gate stack as a mask. Next, the spacer 1005 (e.g. comprising a nitride) is formed on both sides of the gate stack, and a source/drain doping is conducted using both the gate stack and the spacer as a mask, so as to form the final transistor structure. Here, it is to be noted that neither the transistor structure nor the fabricating method thereof is directly related to the present invention. The above descriptions are only to provide an example of a transistor structure and the method of fabricating it to better illustrate the present invention, rather than limiting the invention.

Preferably, in order to reduce the contact resistance to the contacts which are to be formed, a metal silicide layer 1006 may be formed at the source/drain regions of the transistor structures. Such a metal silicide layer 1006 may be formed in various manners. For example, layers of metals such as Ti, Ni, Co and the like may be deposited and then annealed at a certain temperature making the deposited metals react with Si of the source/drain regions, to create the metal silicide; and subsequently, the remaining un-reacted metals are removed. In FIG. 1, for convenience of illustration, the metal silicide layer 1006 is shown as being continuous between two transistor structures. In fact, the metal silicide layer 1006 can be localized on respective source/drain regions of the transistor structures, instead of extending continuously between adjacent transistor structures.

In the above transistor structures, there is a hard mask layer 1004. This hard mask layer 1004 may, for example, be used to protect the gate body layer 1003 in subsequent steps. Here, the hard mask layer 1004 may have a thickness in a range from 20 nm to 70 nm. A thicker hard mask layer (for example, having a thickness of 40-70 nm) is preferable.

Figure 2:
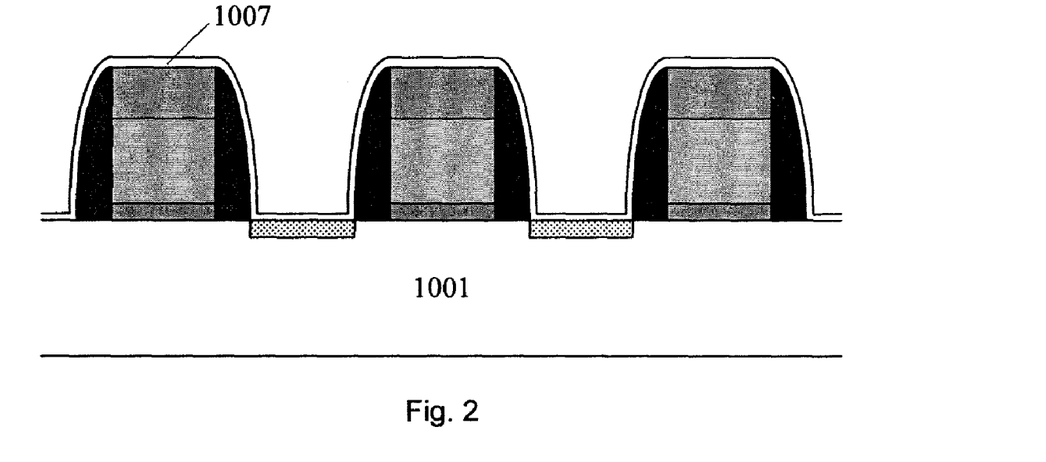
Figure 3:
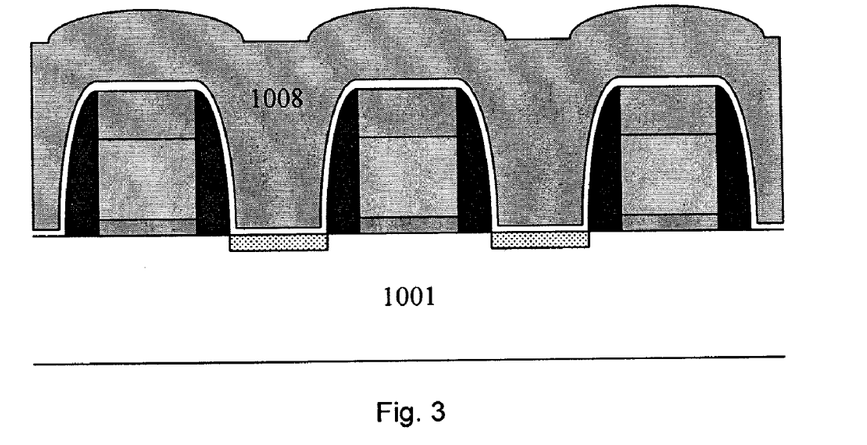
Figure 4:
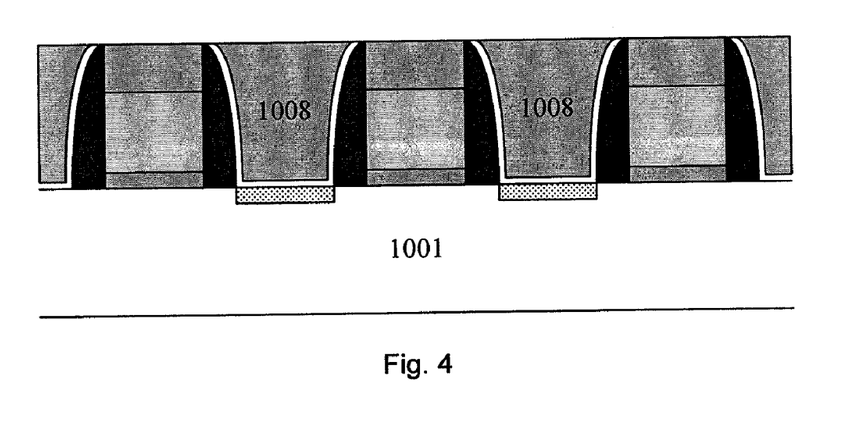

An important feature of the present invention consists in that gaps between the transistor structures on the semiconductor substrate 1001 serve as "contact holes" for being filled with a conductive material. Thus, it is possible to eliminate the photolithography process required for forming the "contact holes" as in the prior art, which have strict requirements thereon. In other words, according to embodiments of the present invention, a contact material (comprising a conductive material and, optionally, a liner material) is directly filled into the gaps (that is, the "contact holes") between the respective transistor structures to form the lower contacts. FIGS. 2-4 show an example of filling the contact material into the gaps ("contact holes") between the transistor structures.

As shown in FIG. 2, preferably, a liner 1007 may be formed on the initial structure 100 by means of a deposition, to improve the adhesion between the conductive material, which is to be formed later, and the substrate. The liner 1007 may, for example, comprise one or more material selected from the group of TiN, TiAlN, TaN, TaAlN, Ta, and Ti. Subsequently, as shown in FIG. 3, a conductive material layer 1008 may be formed, for example, by means of a deposition. The conductive material layer 1008 may comprise metals such as W, Al, Cu, or any other conductive materials suitable for the contacts. Here, said "deposition" comprises various processes for depositing materials, including, but not limited to, CVD (chemical vapor deposition), molecule beam epitaxy (MBE), evaporation and the like, for example.

Next, as shown in FIG. 4, the conductive material layer 1008 and then the liner 1007 are planarized, for example, by means of CMP (chemical mechanical polishing) to stop at the gate (in this embodiment, to the hard mask layer 1004). As a result, the contact material (comprising the liner 1007 and the conductive material layer 1008) is filled in the gaps between the respective gates.

Figure 5:
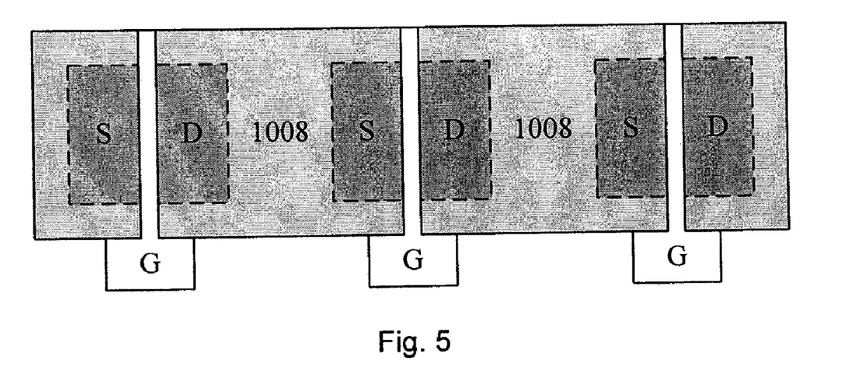

FIG. 5 is a top view for the structure shown in FIG. 4 (it is to be noted that these two figures are not drawn to scale). As shown in FIG. 5, portions at both sides of the gates G, including the sources S and the drains D, are covered by the conductive material layer 1008.

In order to electrically isolate the respective transistor structures from one another, it is necessary to cut off the contact material, including the conductive material layer 1008 and the liner 1007 (if any), between adjacent transistor structures. Optionally, if there is a silicide layer, it is also necessary to cut off the silicide layer 1006 between adjacent transistor structures. (If the silicide layer 1006 is formed so that it is not continuous but is localized on the respective source/drain regions of the transistor structures, it will not be necessary to cut off the silicide layer 1006 here).

Figure 6:
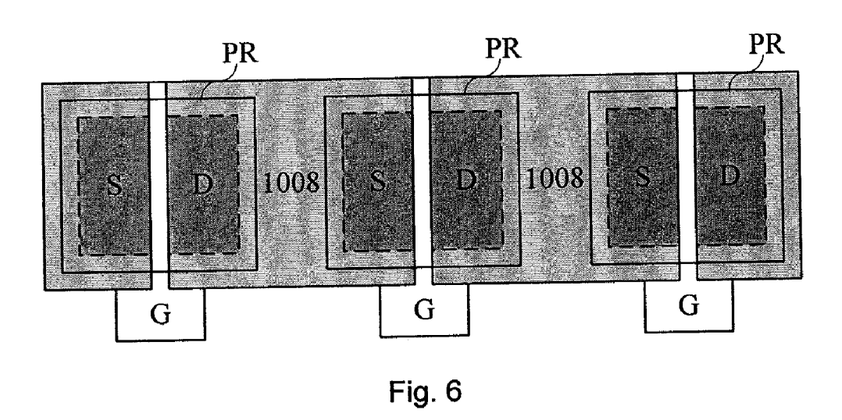

Specifically, for example, as shown in FIG. 6, a photo resist PR is coated on the respective transistor structures and then is patterned to cover at least a portion of the respective sources S and the respective drains D of the transistor structures (it suffices to cover just a portion of the respective sources S and the respective drains D, though in the figure the photo resist PR is shown to cover the whole region of the respective sources S and the respective drains D). In the etching, the coverage of the patterned photo resist in the gate width direction should be less than the gate width, as shown in FIG. 7, so as to etch away the conductive material on both ends of the gates in order to prevent the source and drain of one transistor structure from being shorted through the ends of the gate and also to prevent the respective gates of different transistor structures from being shorted.

Subsequently, etching is performed by using the patterned photo resist PR as a mask, to remove the unnecessary contact material (comprising the conductive material layer 1008 and the optional liner 1007) between the respective transistor structures (in the case where there is a silicide layer 1006, the etching is further performed to remove corresponding portions of the silicide layer 1006). Then, the photo resist PR is removed, and the structure shown in FIG. 7 is obtained. As shown in FIG. 7, the respective transistor structures now are electrically isolated from one another.

Figure 7:
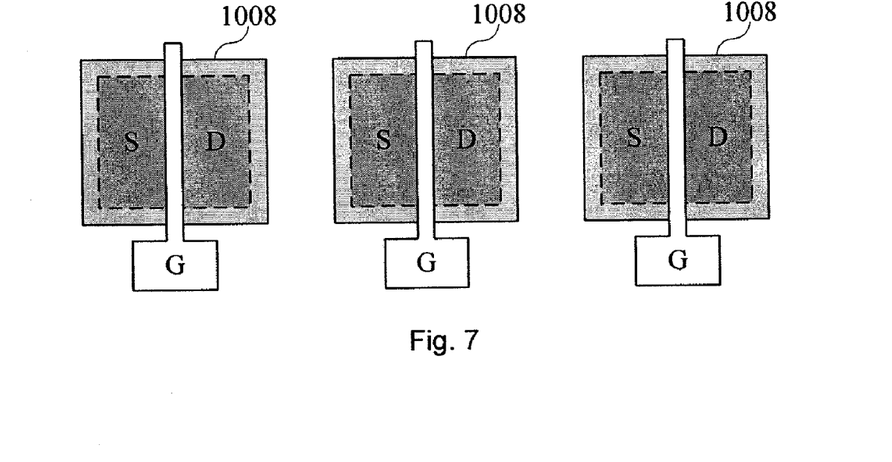
Figure 8:
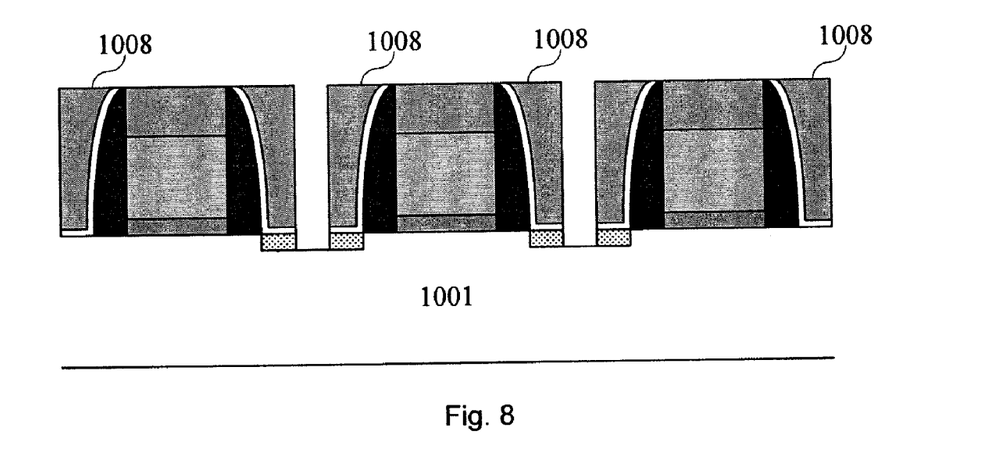

FIG. 8 shows a cross-section view for the structure shown in FIG. 7. As shown in FIG. 8, the respective transistor structures are electrically separated from one another. As compared with the conventional process of forming the lower contacts, the present invention has a larger margin for the etching involved. Moreover, according to the prior art, it is necessary to etch one contact hole respectively for each of the source and drain of one transistor structure. Instead, according to the present invention, it is only necessary to etch one hole between each pair of the transistor structures. Consequently, the process is significantly simplified. According to one embodiment of the present invention, the lower contacts are formed to abut the outer-sidewalls of the gates, so that the distances between the lower contacts and the gates are reduced, resulting in a reduced resistance and thus improved device performances.

Figure 9:
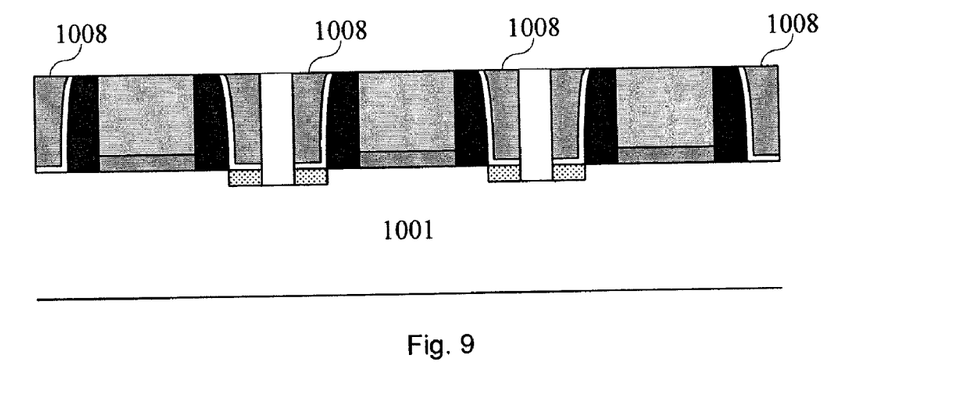

Then, as shown in FIG. 9, the resultant structure is further thinned until the hard mask layer 1004 is removed and the gate body layer 1003 is exposed. Thus, the lower contacts 1008 are formed.

It should be noted that, according to the embodiments of the present invention, in forming the lower contacts 1008, the gaps between the respective transistor structures, especially, the gaps of the gates thereof, serve as the "contact holes", which are then filled to form the lower contacts. Thus, there is no need for a separate photolithography process to form the contact holes. Therefore, the problems caused by the fabrication of the contact holes by means of a photolithography process are eliminated. Furthermore, with the above process, the lower contacts 1008 are self-aligned between the respective gates, and thus will not be shorted with the gates.

In an embodiment of the present invention, it is possible to adjust the width of the spacers 1005 so as to control the size of the space the lower contacts are formed.

Figure 10:
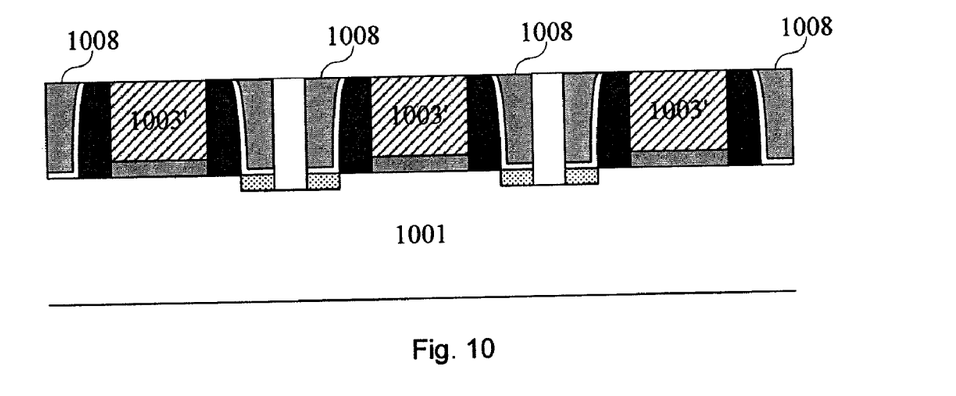
FIG. 10 is a cross-sectional view showing an intermediate device structure in a step of forming a replacement gate according to an embodiment of the present invention.

Besides, according to an embodiment of the present invention, since no (lower) contact is formed above the gates as in reference 1, it is possible to carry out a replacement gate process after the lower contacts 1008 are formed between the respective gates as shown in FIG. 9. For example, as shown in FIG. 10, the original gate body layer 1003 may be replaced with another gate body layer 1003' of a different material. Such a replacement gate process is known in the art, For example, the process is: firstly, the (dummy) gate body layer 1003 (e.g. comprising poly-silicon) is removed; and then a new gate material (e.g. comprising metal) is filled and is subjected to CMP until a new gate body layer 1003' is formed.

Next, the formation of the upper contacts is described with reference to FIGS. 11-14. The formation of the upper contacts may be the same as the conventional process of forming a contact in a dielectric layer. In FIGS. 11-14, there is shown an example of a replacement gate 1003'. However, the present invention also applies to the case where the gate is not replaced (FIG. 9). Specifically, the upper contacts may be formed as follows.

Figure 11:
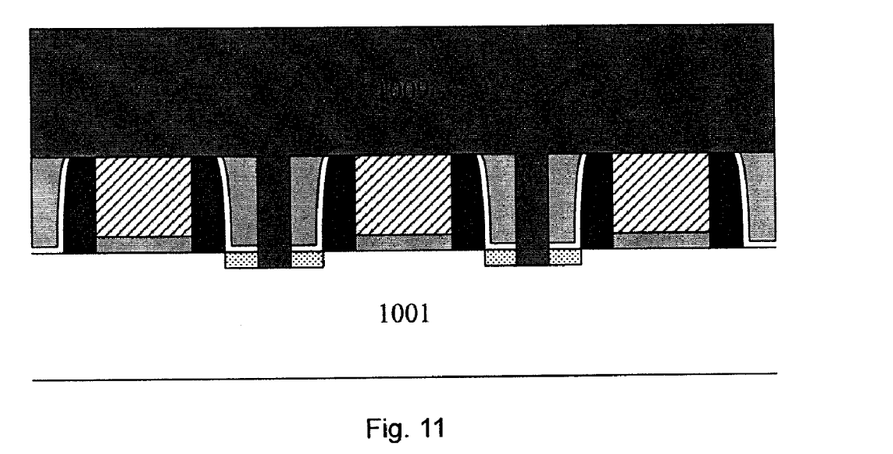
FIGS. 11-14 are cross-sectional views schematically showing intermediate device structures in respective steps of a process flow of forming upper contacts according to an embodiment of the present invention.

First, as shown in FIG. 11, an inter-layer dielectric layer 1009 is deposited. The inter-layer dielectric layer 1009 may, for example, comprise $SiO_2$. The inter-layer dielectric layer 1009 also fills the spaces between the respective transistor structures formed by the above etching, so that the transistor structures are better electrically isolated from each other.

Next, the etching of contact holes is performed. Specifically, as shown in FIG. 12, a photo resist layer 1010 is coated on the inter-layer dielectric layer 1009 and is patterned correspondingly to the contacts to be formed. Then, as shown in FIG. 13, the contact holes 1011 are formed by an etching. Subsequently, the photo resist 1010 is removed. The contact holes 1011 may be aligned with the previously formed lower contacts so as to form upper contacts later which will electrically contact the lower contacts. Alternatively, further contact holes may be formed on the gates so as to form contacts electrically contacting the gates. In FIG. 13, four contact holes 1011 are shown. However, only some of the contact holes or more contact holes may be formed as desired.

Then, as shown in FIG. 14, the upper contacts 1013 are formed in the contact holes 1011. For example, a liner 1012 and a conductive material layer 1013 are deposited sequentially and then are subjected to CMP until the inter-layer dielectric layer is exposed. As a result, the structure shown in FIG. 14 is obtained. Here, the liner 1012 and the conductive material layer 1013 may be of the same materials as the linear 1007 and the conductive material layer 1008 of the lower contacts, respectively, or may be of different materials. For example, the liner 1012 may comprise one or more material selected from the group of TiN, TiAlN, TaN, TaAlN, Ta, and Ti, and the conductive material layer 1013 may comprise metal such as W, Al, Cu and the like or any alloy thereof, or any other conductive materials suitable for the contacts.

Referring to FIGS. 13 and 14, according to the embodiments of the present invention, if there is a need to form upper contacts 1013 concurrently on both the source/drain regions and the gates, the contact holes 1011 should be etched into the inter-layer dielectric layer 1009 to the same depth. As a result, it is easy to control the depth of etching, unlike the prior art where the etching depths must be controlled separately (referring to reference 1, where the depth of contact holes etched on the source/drain regions and the gates are different).

FIG. 14 is a schematic view showing the final structure of the semiconductor device according to the embodiment of the present invention. As shown in FIG. 14, the semiconductor device may comprise: the semiconductor substrate 1001; the gates (1002, 1003 or 1003'), the spacers 1005 on both sides of the gates, and the source/drain regions at both sides of the spacers, which are formed on the semiconductor substrate; the lower contacts 1008 located on the source/drain regions and abutting the outer-sidewalls of the spacers 1005, with bottoms covering at least a portion of the respective source/ drain regions; the inter-layer dielectric layer 1009 formed on the gates, the spacers, the source/drain regions and the lower contacts, wherein the respective source/drain regions of each of the transistor structures are isolated from one another by the inter-layer dielectric layer 1009; and the upper contacts 1013 formed in the inter-layer dielectric layer 1009 and corresponding to the lower contacts 1008.

Preferably, the lower contacts comprise the first liner 1007 and the first conductive material layer 1008, which are deposited sequentially. The first liner may comprise one or more material selected from the group of TiN, TiAlN, TaN, TaAlN, Ta and Ti or any combination thereof, and the first conductive material layer may comprise any one of W, Al and Cu or any combination thereof.

Preferably, the upper contacts comprise the second liner 1012 and the second conductive material layer 1013, which are deposited sequentially.

Preferably, the top of the lower contacts 1008 is flush with the top of the gates. In the direction of gate width, the width of the lower contacts 1008 is less than the gate width.

In the semiconductor device according to the embodiments of the present invention, the lower contacts abut the outer-sidewalls of the gates, so that the distance between the lower contacts and the gates are reduced, resulting in a reduced resistance and thus improved device performances.

Further, according to the embodiments of the present invention, the semiconductor device may be fabricated in a simplified process, facilitating the saving of process flows.

In the above descriptions, the pattering and etching of the respective layers are not detailed. It is to be understood by those skilled in the art that various means in the prior art may be utilized to form the layers and regions in desired shapes. Further, to arrive at the same feature, those skilled can devise different methods than those described above.

The present invention is described above with reference to the embodiments thereof. However, those embodiments are provided just for illustrative purpose, rather than limiting the present invention. The scope of the invention is defined by the attached claims as well as equivalents thereof. Those skilled in the art can make various alternations and modifications without departing from the scope of the invention, which all fall into the scope of the invention.

What is claimed is:

1. A method for fabricating a semiconductor device, comprising:
    forming a plurality of transistor structures on a semiconductor substrate, each of which comprises a gate, a spacer surrounding the gate, and source and drain regions;
    depositing a contact material on the semiconductor substrate, and planarizing the contact material to expose the top of the gates;
    etching the contact material to form lower contacts to at least some of the source region and the drain region of each of the transistor structures;
    depositing an inter-layer dielectric layer; and
    forming contact holes in the inter-layer dielectric layer corresponding to the lower contacts, and filling a further contact material in the contact holes to form upper contacts.

2. The method according to claim 1, wherein the step of depositing the contact material on the semiconductor substrate comprises:
    sequentially depositing a first liner and a first conductive material layer; and
    planarizing the first liner and the first conductive material layer which have been deposited until the top of the gate is exposed.

3. The method according to claim 1, wherein the step of etching the contact material comprises:
    coating and patterning a photo resist layer, so that the patterned photo resist layer covers portions of the respective source and drain regions where the lower contacts are to be formed and leaves spaces where no lower contact is to be formed; and
    etching the contact material by using the patterned photo resist layer as a mask to form the lower contacts.

4. The method according to claim 3, wherein the patterned photo resist layer covers a width less than that of the gates so as to ensure the source and drain regions of an individual one of the transistor structures are electrically isolated from one another.

5. The method according to claim 1, wherein, after the step of forming the lower contacts and before the step of depositing the inter-layer dielectric layer, the method further comprises performing a replacement gate process on the gates of the plurality of the transistor structures.

6. The method according to claim 1, wherein the step of filling the further contact material in the contact holes to form the upper contacts comprises:
    sequentially depositing a second liner and a second conductive material layer; and
    planarizing the second liner and the second conductive material layer which have been deposited until the top of the inter-layer dielectric layer is exposed.

* * * * *